(12) United States Patent
Juengling

(10) Patent No.: US 9,355,709 B2
(45) Date of Patent: *May 31, 2016

(54) DIGIT LINE EQUILIBRATION USING ACCESS DEVICES AT THE EDGE OF SUB-ARRAYS

(71) Applicant: Micron Technology, Inc., Boise, ID (US)

(72) Inventor: Werner Juengling, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/305,842

(22) Filed: Jun. 16, 2014

(65) Prior Publication Data

US 2014/0293720 A1    Oct. 2, 2014

Related U.S. Application Data

(63) Continuation of application No. 13/181,052, filed on Jul. 12, 2011, now Pat. No. 8,760,950, which is a continuation of application No. 12/870,425, filed on Aug. 27, 2010, now Pat. No. 7,986,576, which is a continuation of application No. 12/045,353, filed on Mar. 10, 2008, now Pat. No. 7,800,965.

(51) Int. Cl.
  *G11C 11/4094* (2006.01)
  *G11C 7/12* (2006.01)

(52) U.S. Cl.
  CPC .............. *G11C 11/4094* (2013.01); *G11C 7/12* (2013.01)

(58) Field of Classification Search
  None
  See application file for complete search history.

(56) References Cited

U.S. PATENT DOCUMENTS

| 5,434,821 A | 7/1995 | Watanabe et al. |
| 5,844,833 A | 12/1998 | Zagar et al. |
| 5,862,089 A | 1/1999 | Raad et al. |
| 5,903,502 A | 5/1999 | Porter |
| 5,936,874 A | 8/1999 | Clampitt et al. |
| 5,986,946 A | 11/1999 | Shirley |
| 6,108,251 A | 8/2000 | Manning |
| 6,166,976 A | 12/2000 | Ong |
| 6,272,054 B1 | 8/2001 | Barth, Jr. et al. |
| 6,344,990 B1 | 2/2002 | Matsumiya et al. |
| 6,400,596 B2 | 6/2002 | Takemura et al. |

(Continued)

FOREIGN PATENT DOCUMENTS

| CN | 1513185 A | 7/2004 |
| CN | 1716448 A | 1/2006 |

(Continued)

OTHER PUBLICATIONS

International Search Report for International Application No. PCT/US2009/036563, dated Oct. 13, 2009, 3 pages.

(Continued)

*Primary Examiner* — James G Norman
(74) *Attorney, Agent, or Firm* — TraskBritt

(57) ABSTRACT

A method of equilibrating digit lines, a memory array, device, system and wafer for digit lines configured in an open digit line architecture. The digit lines are equilibrated by coupling a terminated end of a first digit line to an equilibration reference and coupling an unterminated end of a second digit line to the terminated end of the first digit line. The memory array is configured with the first and second digit lines arranged directly adjacent to each other.

20 Claims, 10 Drawing Sheets

(56) References Cited

U.S. PATENT DOCUMENTS

| | | |
|---|---|---|
| 6,403,430 B1 | 6/2002 | Clampitt |
| 6,438,049 B1 | 8/2002 | Porter |
| 6,455,367 B2 | 9/2002 | Clampitt et al. |
| 6,480,407 B1 | 11/2002 | Keeth |
| 6,482,731 B1 | 11/2002 | Juengling |
| 6,504,775 B1 | 1/2003 | Ma et al. |
| 6,535,439 B2 | 3/2003 | Cowles |
| 6,590,819 B1 | 7/2003 | Baum et al. |
| 6,635,917 B2 | 10/2003 | Juengling |
| 6,650,584 B2 | 11/2003 | Cowles |
| 6,678,199 B1 | 1/2004 | Joo |
| 6,714,434 B2 | 3/2004 | Morgan |
| 6,746,917 B2 | 6/2004 | Juengling |
| 6,753,220 B2 | 6/2004 | Juengling |
| 6,785,176 B2 | 8/2004 | Demone |
| 6,844,594 B2 | 1/2005 | Juengling |
| 6,882,557 B2 | 4/2005 | Kajigaya et al. |
| 6,936,899 B2 | 8/2005 | Juengling |
| 6,949,430 B2 | 9/2005 | Juengling |
| 7,009,250 B1 | 3/2006 | Mouli |
| 7,022,825 B2 | 4/2006 | Ashley et al. |
| 7,038,958 B2 | 5/2006 | Joo et al. |
| 7,098,105 B2 | 8/2006 | Juengling |
| 7,110,319 B2 | 9/2006 | Kim et al. |
| 7,382,668 B2 | 6/2008 | Park et al. |
| 7,476,933 B2 | 1/2009 | Juengling |
| 7,573,108 B2 | 8/2009 | Juengling |
| 7,800,965 B2 | 9/2010 | Juengling |
| 7,986,576 B2 | 7/2011 | Juengling |
| 2003/0002370 A1 | 1/2003 | Cowles |
| 2003/0030150 A1 | 2/2003 | Keeth |
| 2003/0043645 A1 | 3/2003 | Pinney |
| 2003/0142567 A1* | 7/2003 | Demone .............. G11C 7/12 365/203 |
| 2006/0102977 A1 | 5/2006 | Fucsko et al. |
| 2006/0198220 A1 | 9/2006 | Yoon et al. |
| 2006/0268638 A1 | 11/2006 | Yoon et al. |
| 2006/0289914 A1 | 12/2006 | Juengling |
| 2007/0047350 A1 | 3/2007 | Jeong et al. |
| 2007/0091686 A1 | 4/2007 | Won |
| 2009/0225612 A1 | 9/2009 | Juengling |
| 2011/0267912 A1 | 11/2011 | Juengling |

FOREIGN PATENT DOCUMENTS

| | | |
|---|---|---|
| CN | 1822208 A | 8/2006 |
| CN | 1941162 A | 4/2007 |
| KR | 100838363 B1 | 6/2008 |

OTHER PUBLICATIONS

International Written Opinion for International Application No. PCT/US2009/036563, dated Oct. 14, 2009, 5 pages.
International Preliminary Amendment for International Application No. PCT/US2009/036563, dated Sep. 14, 2010, 6 pages.
Chinese First Office Action for Chinese Application No. 201301553496.0, dated Sep. 16, 2015, 13 pages.

* cited by examiner

DIGIT LINE EQUILIBRATION USING ACCESS DEVICES AT THE EDGE OF SUB-ARRAYS

CROSS-REFERENCE TO RELATED APPLICATIONS

This application is a continuation of U.S. patent application Ser. No. 13/181,052, filed Jul. 12, 2011, now U.S. Pat. No. 8,760,950, issued Jun. 24, 2014, which is a continuation of U.S. patent application Ser. No. 12/870,425, filed Aug. 27, 2010, now U.S. Pat. No. 7,986,576, issued Jul. 26, 2011, which is a continuation of U.S. patent application Ser. No. 12/045,353, filed Mar. 10, 2008, now U.S. Pat. No. 7,800,965, issued Sep. 21, 2010, the disclosure of each of which is hereby incorporated herein in its entirety by this reference.

FIELD

Various embodiments of the present invention relate generally to the field of volatile memory devices and, more particularly, to equilibrating digit lines of a random access memory.

BACKGROUND

A memory device such as a dynamic random access memory (DRAM) device conventionally comprises a number of memory cells arranged in rows and columns. The memory cells are grouped into sub-arrays. Each memory cell includes a capacitor capable of holding a charge and an access transistor for accessing the capacitor charge. The charge is referred to as a data bit and can be either a high voltage or a low voltage. Data can be either stored in the memory cells during a write mode, or data may be retrieved from the memory cells during a read mode. The access transistors of the memory cells connect to internal signal lines, referred to as bit or digit lines. The digit lines connect to input/output lines through input/output transistors, which are used as switching devices to allow data to be transmitted between the digit lines and the input/output lines during a read or write mode.

A number of sense amplifiers are included in the memories to both sense data stored in the memory cells and amplify the data for outputting. Each sense amplifier compares a charge stored on a memory cell with a known reference. A sense amplifier conventionally connects to two digit lines to perform the sensing operation. In the sensing operation, the two digit lines are first equalized using an equilibrate circuit to a reference voltage that is typically, but not limited to, one-half of the supply voltage (Vcc), also sometimes referred to as DVC2. After that, the digit lines are driven to opposite voltage levels. That is, one of the digit lines is driven to Vcc and the other is driven to ground. The voltage on the digit line connected to the memory cell being accessed indicates the value of data stored in the memory cell.

In an open digit line memory device, all digit lines are interleaved. Specifically, due to the relatively larger dimensions of a sense amplifier compared with the dimensions of a memory cell, one digit line of a sub-array connects to one sense amplifier on one side of the sub-array, and an adjacent digit line connects to another sense amplifier on the other side of the sub-array. Therefore, a digit line has a terminated end that directly couples to the sense amplifier through which the logic states are programmed or sensed and an extended or unterminated end that has the highest impedance path to that sense amplifier.

Since the sensing circuitry on each side of the sub-array only accesses every other, or alternating, digit lines, the sense amplifiers may be implemented on the edge of the sub-array according to double the spacing, or pitch, of the digit lines. The physical space required to implement the sense amplifiers typically limits the density of the memory cells in the sub-array. Accordingly, the open digit line architecture with interleaved digit lines facilitates small digit line pitch sizes since the sense amplifiers are implemented on alternating sides of the memory sub-array. Furthermore, small digit line pitch sizes allow for high density sub-arrays, which result in a large quantity of attached memory cells and a relatively large physical length of the digit line through the sub-array.

In order to prepare digit lines for sensing logic values from the memory cells, equilibrate circuits have been formed to electrically balance the digit lines. Conventional equilibrate circuits have been designed as part of the sense amplifier and have been designed according to larger feature sizes associated with the sense amplifiers. These larger feature sizes of the equilibrate circuit are undesirable in view of attempts to further reduce the size of a memory array and the associated circuitry.

For the reasons stated above, and for other reasons stated below that will become apparent to those skilled in the art upon reading and understanding the present specification, there is a need in the art for an improved equilibrate circuit that does not affect the pitch of the interleaved digit lines.

DETAILED DESCRIPTION

In the following detailed description, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be implemented, and that structural, logical and electrical changes may be made without departing from the spirit and scope of the present invention.

A method of equilibrating digit lines, a memory array, device, system and wafer including the same are disclosed. In one embodiment of the present invention, digit lines in a memory device are equilibrated by coupling a terminated end of a first digit line to an equilibration reference and at least partially concurrently therewith, an unterminated end of a second digit line is coupled to the terminated end of the first digit line. The memory array is configured in an open digit line arrangement with the first and second digit lines arranged directly adjacent to each other.

Figure 1:
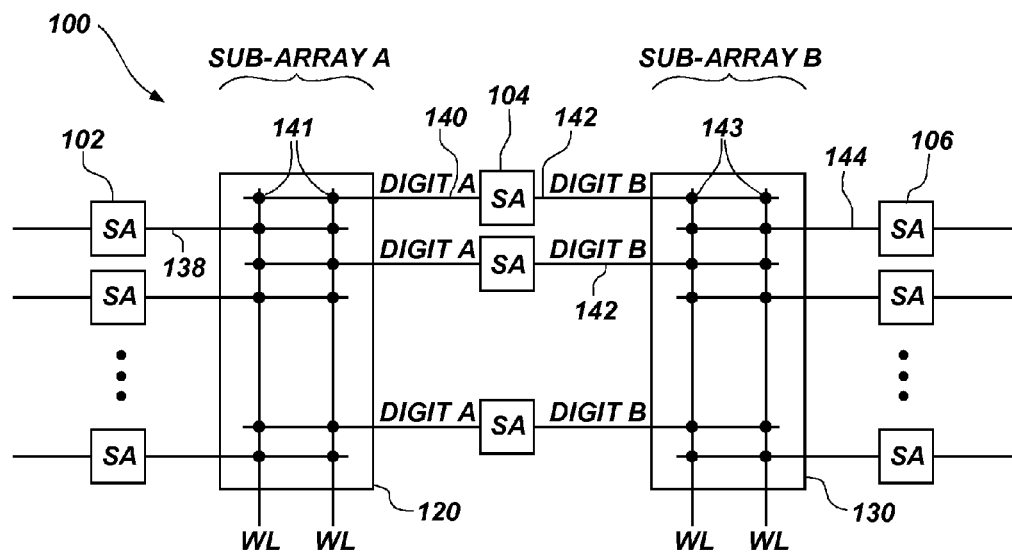
FIG. 1 is a block diagram of a portion of an open digit line architecture of a memory device including a plurality of memory sub-arrays, in accordance with various embodiments of the present invention.

FIG. 1 is a diagram of a portion of a memory array 100 in accordance with various embodiments of the invention. Memory array 100 includes a plurality of sub-arrays including sub-array A 120 and sub-array B 130, a plurality of sense amplifiers (SA) 102, 104, 106 and the memory array 100 is configured according to an open digit line architecture. By way of illustration, a memory cell is located at each row and column intersection with the memory cells in the same column connected to the same digit line, DIGIT A or DIGIT B. The memory cells in the same row connect to the same row line or word line, WL. That is, the digit lines are interleaved, such that an activated word line WL will access a memory cell on each digit line.

Each of the sense amplifiers 104 connects to a first digit line 140, e.g., DIGIT A, on one side and a second digit line 142, e.g., DIGIT B on the opposite side. First digit line A 140 connects to a plurality of memory cells 141, indicated by dots at each intersection of a digit line and a word line, WL, in sub-array A 120. Second digit line B 142 also connects to a plurality of memory cells 143 in sub-array B 130, which are similar to those in sub-array A 120. Digit lines A 140 are interleaved with digit lines 138 in sub-array A 120 and digit lines B 142 are interleaved with digit lines 144 in sub-array B 130.

In another embodiment of the present invention, a memory array is disclosed and includes a memory sub-array configured in an open digit line architecture. The memory array further includes an equilibrate circuit configured to equilibrate a plurality of digit lines in the memory sub-array. Furthermore, the equilibrate circuit includes pass transistors configured at less than the digit line pitch.

Figure 2:
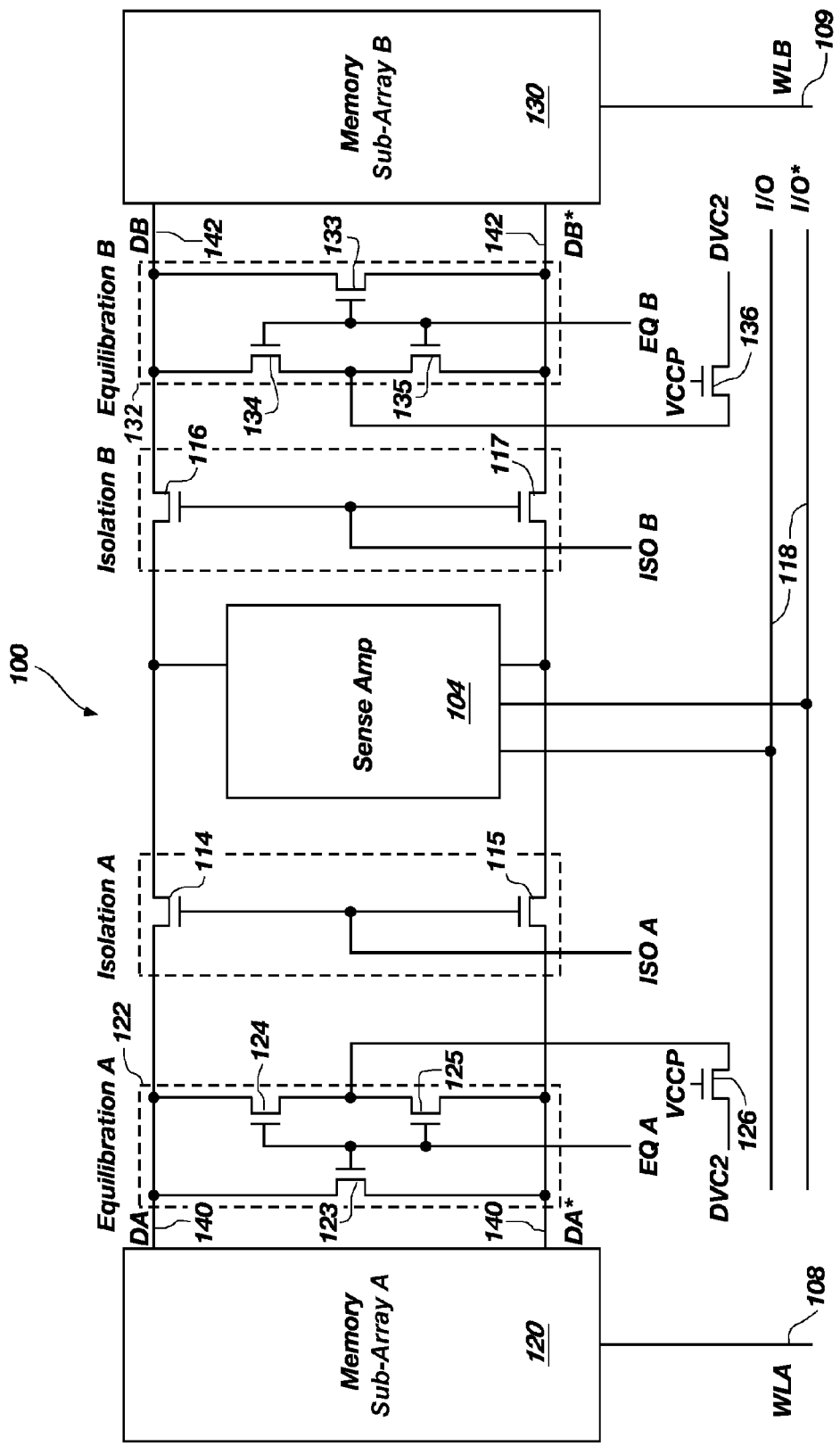
FIG. 2 illustrates equilibrate and isolation circuitry, in accordance with various embodiments of the present invention.

FIG. 2 illustrates equilibrate and isolation circuitry for coupling a memory sub-array with a sense amplifier, in accordance with various embodiments of the present invention. The sense amplifier 104 may sense a first memory sub-array A 120 and a second memory sub-array B 130, each of which contains a plurality of memory cells. The sense amplifier 104 senses the voltage level in a selected memory cell of the selected sub-array A 120 or sub-array B 130, via the pair of complementary digit lines 140 or a selected memory cell of the selected sub-array B 130, via the pair of complementary digit lines 142, respectively. One of sub-array A 120 or sub-array B 130 is selected by the application of a signal to a word line 108 or 109 corresponding to a memory cell in memory sub-array A 120 or memory sub-array B 130, respectively, and the application of a signal to ISOA and ISOB to transistors 114, 115 and 116, 117, respectively. Thus, when ISOA is enabled and driven to a logic high value, transistors 114 and 115 become conductive, i.e., turn on, to connect sub-array A 120 to sense amplifier 104. When ISOB is enabled and driven to a logic high value, transistors 116 and 117 turn on to connect sub-array B 130 to sense amplifier 104.

Equilibrate circuits 122 and 132 are provided to pre-charge the digit lines. For simplicity, the operation of equilibrate circuit 122 for the memory sub-array A 120 side of the sense amplifier 104 is now described, it being understood that equilibrate circuit 132 operates the same way for the memory sub-array B 130 side of the sense amplifier 104, including transistors 133-136.

Equilibrate circuit 122 includes transistor 123 with a first source/drain region coupled to digit line 140, a second source/drain region coupled to the complementary digit line 140 and a gate coupled to receive an equilibration signal labeled EQA. Equilibrate circuit 122 further includes transistors 124, 125 and 126. Transistor 124 includes a first source/drain region that is coupled to digit line 140, a gate that is coupled to receive the equilibration signal EQA, and a second source/drain region that is coupled to a first source/drain region of transistor 126. Transistor 125 includes a first source/drain region that is coupled to complementary digit line 140, a gate that is coupled to receive the equilibration signal EQA, and a second source/drain region that is coupled to the first source/drain region of transistor 126. Transistor 126 has a second source/drain region that is coupled to an equilibration voltage DVC2, typically Vcc/2, and a gate that is connected to a pumped Vcc voltage, VCCP, which is typically about one to two volts higher than Vcc. The application of VCCP to the gate of transistor 126 causes transistor 126 to supply equilibrated voltage to transistors 124, 125. When the EQA signal is at a high logic level, transistors 124, 125 apply the equilibrated voltage to the digit lines 140, and transistor 123 shorts the lines such that both lines are equilibrated to the voltage Vcc/2 also referred to as DVC2.

During a read operation, the digit lines 140 will go to Vcc or GND depending on the stored charge in the read memory cell. The sense amplifier 104 senses the differential voltage across the digit lines 140, which represents the charge stored in the accessed memory cell, and drives the one of the digit lines 140 containing the higher voltage to Vcc and the other one of the digit lines 140 containing the lower voltage to GND. These respective voltages, Vcc and GND, are also provided to I/O, I/O* lines 118.

According to sense amplifier layouts known in the art, equilibrate circuits for respective sense amplifiers are conventionally positioned within the sense amplifier circuit blocks of the memory device layout. In such a configuration, the equilibrate transistors 123, 124, 125 are fabricated using larger feature sizes of the sense amplifiers resulting in a much larger circuit area. However, according to the various embodiments of the present invention, the equilibrate circuits for the sense amplifiers are not located within the sense amplifier blocks, but instead are located within or as an extension to the memory sub-array blocks. Specifically, the various embodiments of the present invention form the equilibrate circuit after the last memory cell along the word line at the edge of the memory sub-array. Furthermore, the various embodiments of the present invention enable the equilibrate circuit to be faulted according to the generally smaller layout dimensions of the memory sub-array, which is in contrast to the prior art equilibrate circuits formed in or near the sense amplifiers according to the layout dimensions and rules of the devices associated with the sense amplifiers. Forming equilibrate circuits according to sense amplifier design guidelines results in an unnecessarily bulky design and places the equilibrate circuit yet further away from the portion of the digit line that passes through the memory sub-array.

Figure 3:
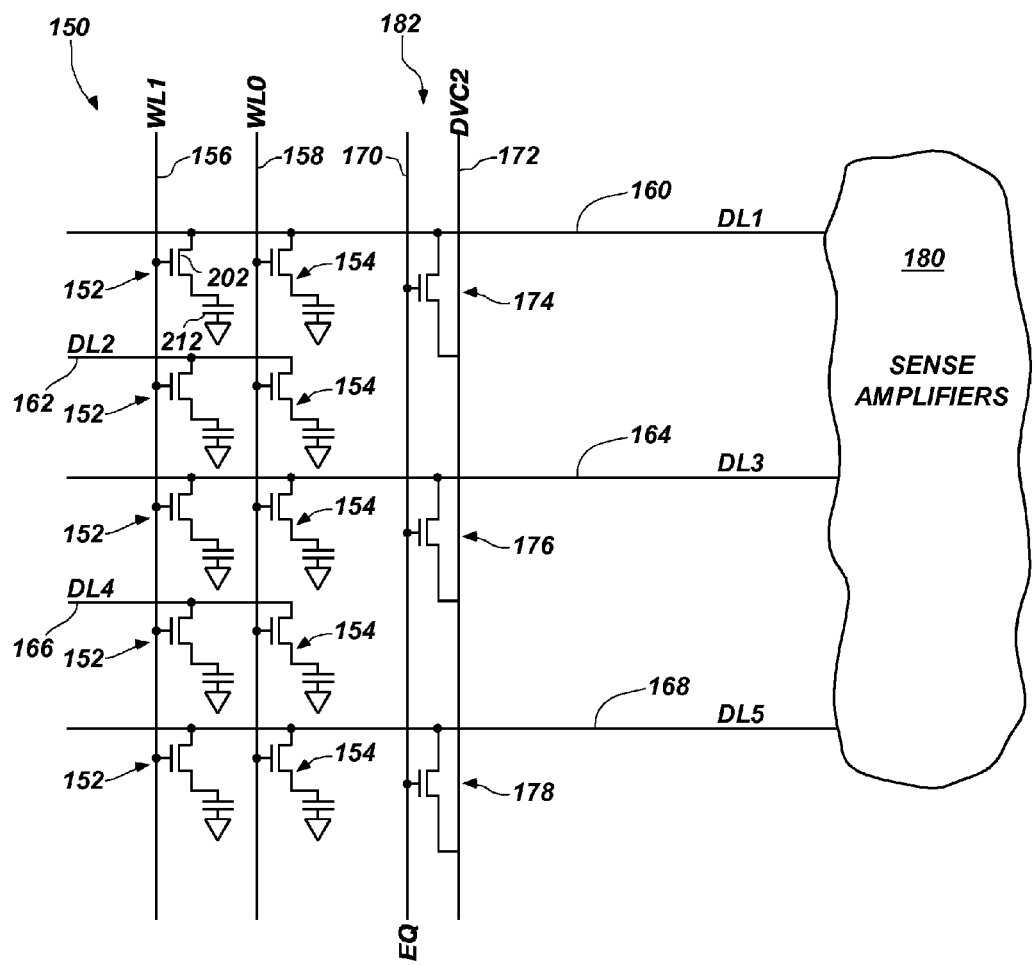
FIG. 3 illustrates an equilibrate circuit for a portion of a memory sub-array, in accordance with various embodiments of the present invention.

FIG. 3 illustrates a circuit diagram of an equilibrate circuit in a portion of a memory sub-array 150, in accordance with an embodiment of the present invention. A portion of a memory sub-array 150 is illustrated in an open-digit line architecture that includes interleaved digit lines. In FIG. 3, a plurality of memory cells 152 is arrayed along word line WL1 156 and a plurality of memory cells 154 are further arrayed along word line WL0 158. Digit lines DL1-DL5 160-168, respectively, are interleaved through the memory sub-array 150. Specifically, memory cells 154 are the initial memory cells along digit line DL1 160, digit line DL3 164 and digit line DL5 168 that connect to sense amplifiers 180. Memory cells 154 represent the last or terminal memory cells along digit line DL2 162 and digit line DL4 166 that connect to sense amplifiers (not shown) located on the opposite side of the memory sub-array 150.

As stated, prior to a read operation of the memory sub-array 150, the digit lines DL1-DL5 160-168 must be equilibrated to remove undesirable electrical charge from the digit lines prior to sensing the logic state of the memory cells in the sub-array of the memory device. The present embodiment utilizes an equilibrate circuit 182 formed at the edge of the memory sub-array 150 according to the layout criteria and processes of the memory sub-array 150 as opposed to the layout criteria of the sense amplifiers 180. Accordingly, the equilibrate circuit 182 includes equilibration pass transistor 174 formed at the edge of the memory sub-array 150 formed as part of the memory sub-array 150. By way of illustration, equilibration pass transistor 174 connects the digit line DL 1 160 to an equilibration reference 172 (DVC2) when activated by an equilibrate signal 170. FIG. 3 further illustrates equilibration pass transistor 176 similarly connected for equilibrating digit line DL3 164 and equilibration pass transistor 178 for equilibrating digit line DL5 168. It should be noted that since the memory sub-array 150 is configured according to an open digit line architecture, digit line DL2 162 and digit line DL4 166 are equilibrated by another portion of the equilibrate circuit (not shown) similarly configured on the opposite side of the memory sub-array 150.

Figure 4:
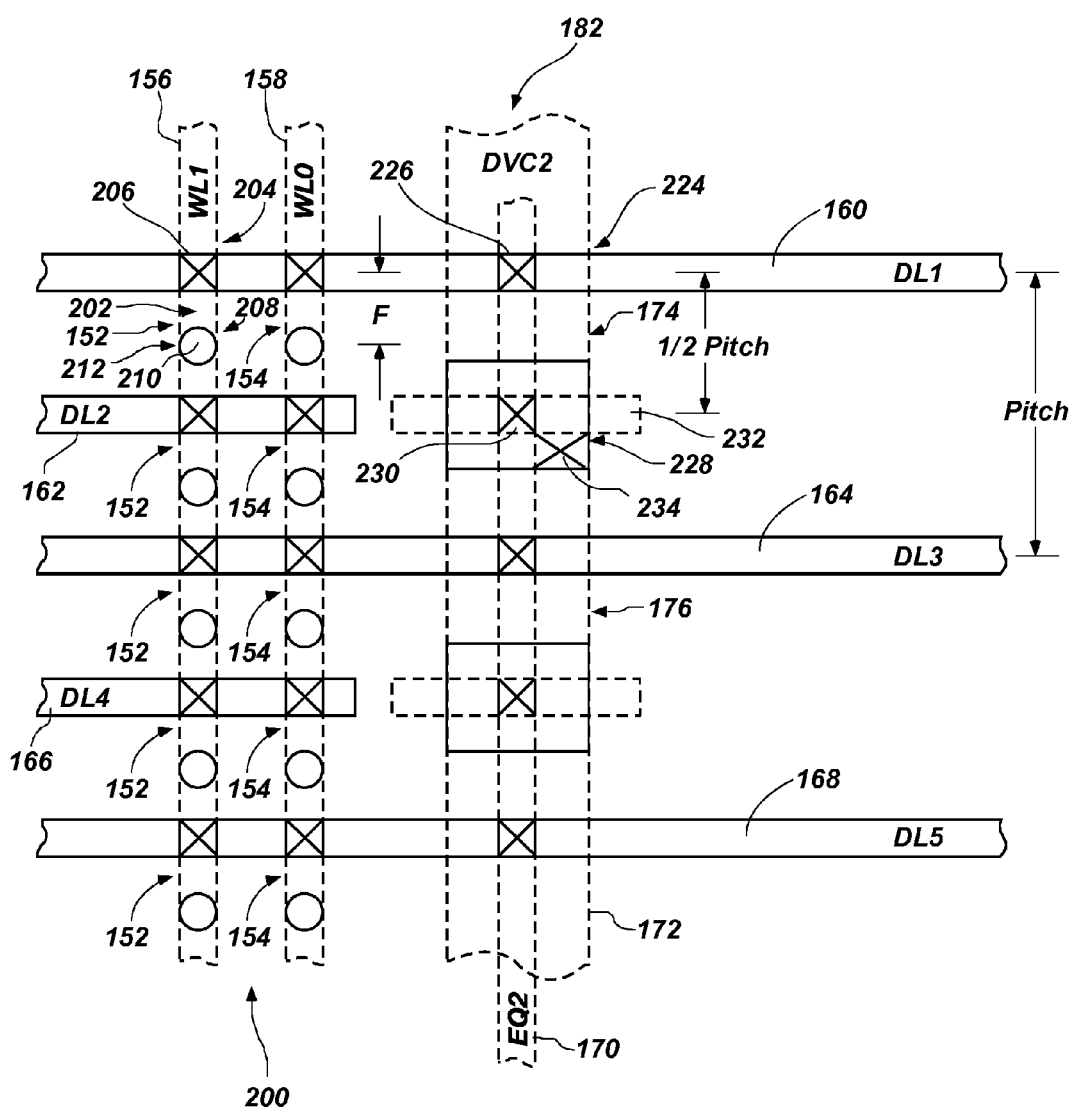
FIG. 4 illustrates a physical layout of the equilibrate circuit of FIG. 3, in accordance with various embodiments of the present invention.

FIG. 4 illustrates a physical layout of an edge of a sub-array of memory cells of the circuit illustrated in FIG. 3, according to one or more embodiments of the present invention. The present invention departs from conventional DRAM layouts known in the art by relocating equilibrate circuits within the array and adjacent the last row of memory cells 154 at the edge of memory sub-array 150. The equilibrate signal 170 for the equilibration transistors is adjacent the word lines WL of the memory sub-array 150 and the equilibrate signal 170 is configured to be formed according to the process steps and dimensions of the next adjacent word line WL. Furthermore, the physical layout of FIG. 4 illustrates digit line DL1 160 and digit line DL3 164 being separated by a single digit line pitch.

As shown in FIG. 4, block 200 of memory cells 152, 154 is formed in a substrate according to one or more known methods, non-limiting examples of which are disclosed in U.S. patent application Ser. No. 11/366,212, filed Mar. 2, 2006, issued as U.S. Pat. No. 7,476,933 on Jan. 13, 2009 and titled "Vertical Gated Access Transistor" assigned to the assignee of the present application, and U.S. patent application Ser. No. 11/433,533, filed May 12, 2006, issued as U.S. Pat. No. 7,573,108 on Aug. 11, 2009 and titled "Non-Planar Transistor and Techniques for Fabricating the Same," assigned to the assignee of the present application, the disclosures of which are herein incorporated by reference in their entirety. By way of example and not limitation, a single memory cell and corresponding portion of an equilibrate circuit is described with a similar configuration for each memory cell and each digit line. As stated, the memory sub-array 150 (FIG. 3) is configured in an open digit line architecture where the digit lines are interleaved. Therefore, while a portion of the equilibrate circuit is illustrated for one edge of the memory sub-array 150, a symmetric portion would also be implemented on the opposite edge (not shown) of the memory sub-array 150 for equilibrating the other portion of the interleaved digit lines.

As illustrated, a memory cell 152 includes a pass transistor 202 formed between a vertical pillar 204 configured for coupling by way of a contact 206 (denoted by an "X") to digit line DL1 160. The pass transistor 202 is further formed to include another vertical pillar 208 configured for coupling via a contact 210 (denoted by a "O" to a capacitor 212). The pass transistor 202 is controlled by word line WL1 156 which, when activated, connects the capacitor 212 (FIG. 3) to the digit line DL1 160.

As stated, digit lines must be equilibrated to a neutral reference that is not biased to favor the reading of one logic state over another logic state. The equilibrate circuit 182 is responsive to an equilibrate signal 170 for activating equilibration pass transistors 174, 176. According to the embodiment illustrated with reference to FIGS. 3 and 4, the equilibration pass transistor 174 is configured as a vertically gated pass transistor formed at half the digit line pitch (width of the feature plus the space to the next repeated feature) of the memory sub-array 150. As stated, conventional equilibrate circuits have been formed according to the design parameters of the sense amplifiers, which are designed at much larger dimensions than the half pitch equilibration pass transistors of the equilibrate circuit of the various embodiments of the present invention.

The equilibration pass transistor 174 is also formed according to the processes of formation of the pass transistor of the memory cell, however, the equilibration pass transistor 174 is formed as a long transistor to maintain similar processing steps as are performed during the manufacturing of the memory sub-array 150. The equilibration pass transistor 174 couples the digit line DL1 160 to an equilibration reference 172 (DCV2) when the equilibrate signal 170 is asserted. The equilibration pass transistor 174 is formed between a vertical pillar 224 configured for coupling by way of a contact 226 (denoted by an "X") to digit line DL1 160. The equilibration pass transistor 174 is further formed to include another vertical pillar 228 configured for coupling via a contact 230 (denoted by an "X") to an isolated portion 232 of the digit line layer for manufacturing simplicity. A subsequent contact 234 denoted by a larger "X" continues the contacting of the equilibration pass transistor 174 to the equilibration reference 172 (DCV2) when the equilibrate signal 170 is asserted.

Figure 5:
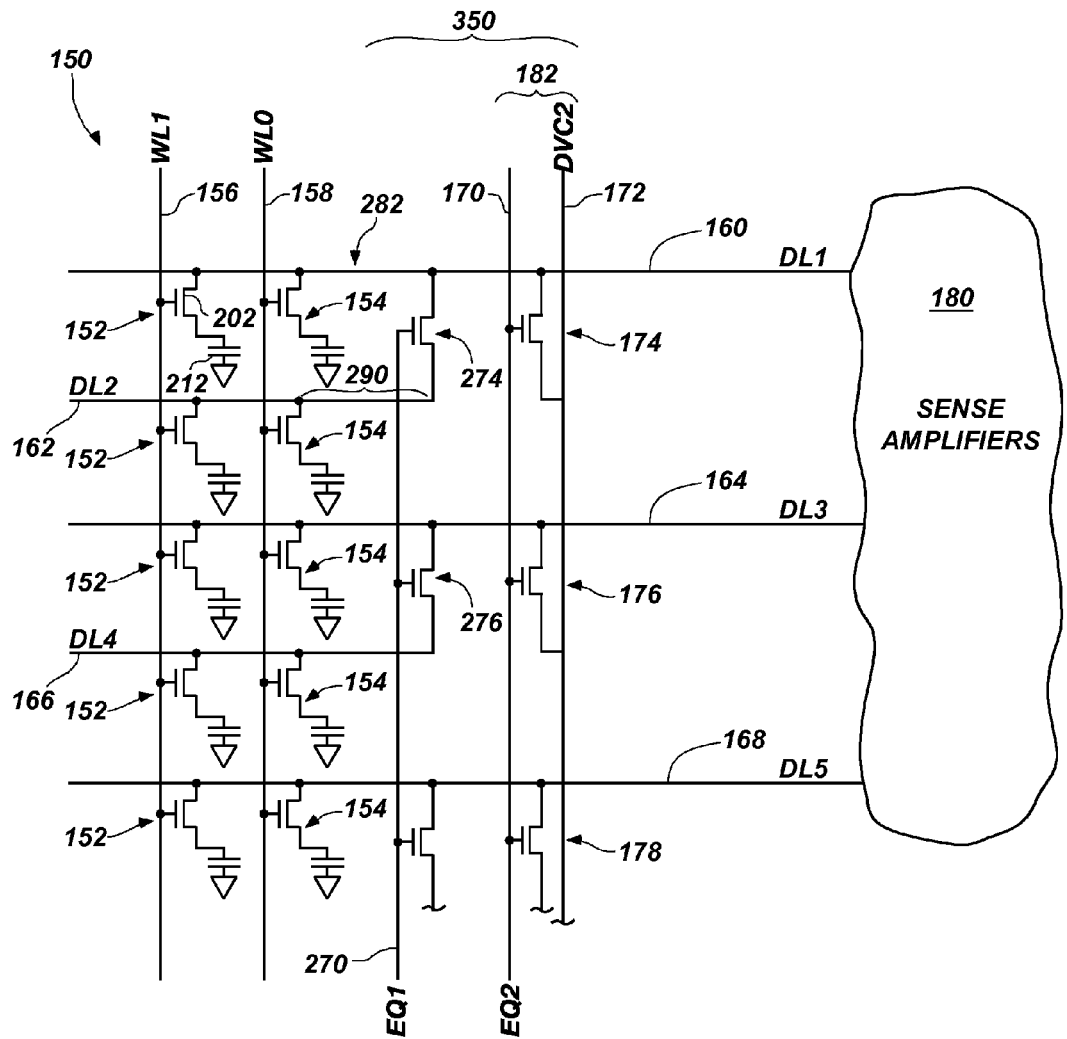
FIG. 5 illustrates another equilibrate circuit for a portion of a memory sub-array, in accordance with various embodiments of the present invention.

FIG. 5 illustrates a circuit diagram of an equilibrate circuit in a portion of a memory sub-array 150, in accordance with various other embodiments of the present invention. A portion of a memory sub-array 150 is illustrated in an open digit line architecture that includes interleaved digit lines. In the present embodiment, an equilibrate circuit is formed at the edge of the memory sub-array 150 according to the layout criteria of the memory sub-array 150 as opposed to the layout criteria of the sense amplifier. Accordingly, an equilibrate boosting circuit 282 includes an equilibrate boosting pass transistor 274 formed at the edge of the memory sub-array 150 and is further formed as part of the memory sub-array 150. By way of illustration, equilibrate boosting pass transistor 274 connects the digit line DL1 160 to the digit line DL2 162 when activated by an equilibrate boosting signal 270. In one embodiment, the equilibrate boosting signal 270 is activated to match the duty cycle of the equilibrate signal 170. In another embodiment of the present invention, the equilibrate boosting signal 270 is activated during a portion of the activation of equilibrate signal 170 to provide an equilibration boost to an equilibrate circuit 350 by reducing the resistance of the digit line during the equilibration process. To form the connection with digit line DL2 162, the digit line DL2 162 is formed to include an extended portion 290 of digit lines DL at their extended end opposite the digit line end connected to the sense amplifier.

The equilibrate boosting circuit 282 enhances equilibration speed by coupling the extended or unterminated end of the digit line during equilibration with an adjacent digit line very near an equilibrate circuit. The equilibrate boosting circuit 282 enables the charge on the digit line to be equilibrated from both ends of the digit line by connecting the extended or unterminated end of the digit line with an adjacent digit line that is physically near an equilibrate circuit. Equilibrating a digit line from both ends provides a lower resistance along the digit line as well as provides multiple current paths for charging or discharging the digit line. In one embodiment, the equilibrate circuit utilized by the equilibrate boosting circuit 282 is located within the sense amplifiers 180. In another embodiment, the equilibrate boosting circuit 282 utilizes an equilibrate circuit 182 as described with respect to FIGS. 3 and 4.

Figure 6:
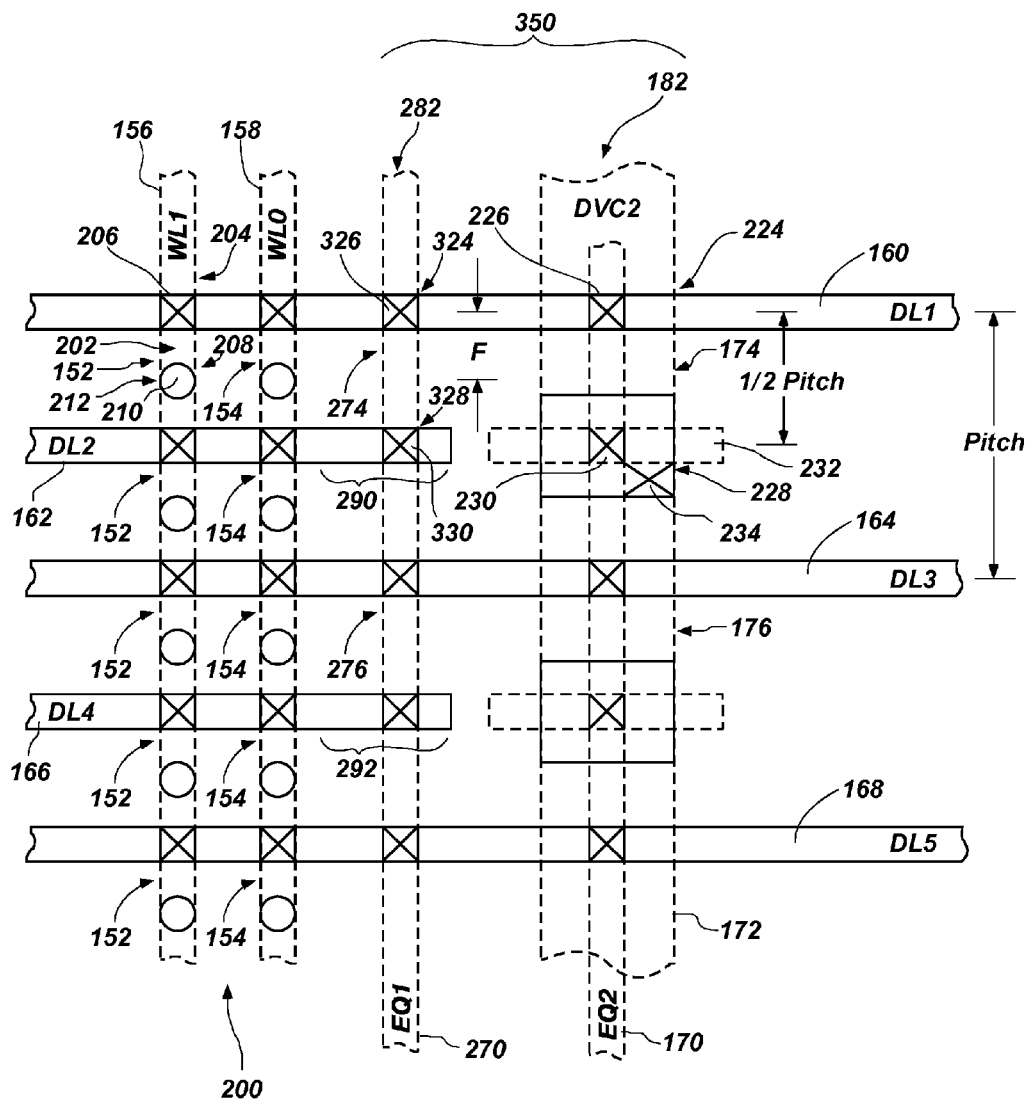
FIG. 6 illustrates a physical layout of the equilibrate circuit of FIG. 5, in accordance with various embodiments of the present invention.

FIG. 6 illustrates a physical layout of an edge of a sub-array of memory cells of the circuit illustrated in FIG. 5, according to one or more embodiments of the present invention. The equilibrate boosting circuit 282 includes an equilibrate boosting signal 270 for activating equilibrate boosting pass transistors 274, 276. According to the embodiment illustrated with reference to FIG. 6, the equilibrate boosting pass transistor 274 is configured as a vertically gated pass transistor formed at half the digit line pitch (width of the feature plus the space to the next repeated feature) of the memory sub-array 150 (FIG. 3). As stated, conventional equilibrate circuits have been formed according to the design parameters of the sense amplifiers, which are designed at much larger dimensions than the half pitch equilibration pass transistors of the equilibrate circuit of the various embodiments of the present invention.

The equilibrate boosting pass transistor 274 is also formed as a vertical transistor as are the memory cell pass transistors; however, the equilibration pass transistor 174 is formed as a long transistor and maintains similar design dimensions as are used for the manufacturing of the memory sub-array 150. The equilibrate boosting pass transistor 274 couples the digit line DL1 160 to digit line DL2 162 when the equilibrate boosting signal 270 is asserted. The equilibrate boosting pass transistor 274 is formed between a vertical pillar 324 configured for coupling by way of a contact 326 (denoted by an "X") to digit line DL1 160. The equilibrate boosting pass transistor 274 is further formed to include another vertical pillar 328 configured for coupling via a contact 330 (denoted by an "X") to an extended portion 290 of the digit line DL2 162. Likewise, digit line DL4 166 may include an extended portion 292.

As stated, the equilibrate circuit may be implemented as equilibrate circuit 182 rather than relying on an equilibrate circuit in the sense amplifier. Accordingly, in another embodiment, an equilibrate circuit 350 may include the combination of equilibrate circuit 182 and equilibrate boosting circuit 282.

Figure 7:
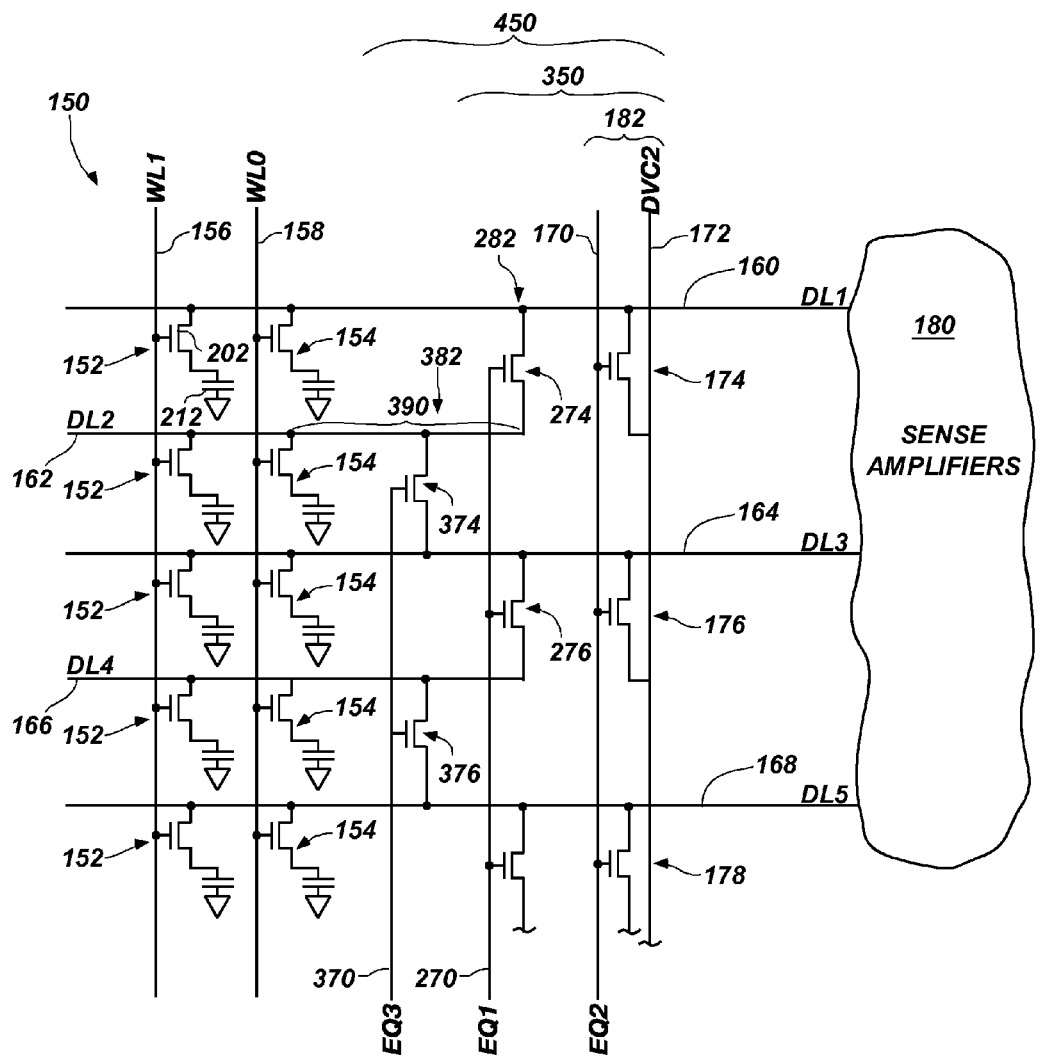
FIG. 7 illustrates yet another equilibrate circuit for a portion of a memory sub-array, in accordance with various embodiments of the present invention.

FIG. 7 illustrates a circuit diagram of an equilibrate circuit in a portion of a memory sub-array 150, in accordance with various other embodiments of the present invention. A portion of a memory sub-array 150 is illustrated and is implemented as described hereinabove. In one illustrated embodiment, an equilibrate circuit 450 is formed at the edge of the memory sub-array 150 according to the layout criteria of the memory sub-array 150 as opposed to the layout criteria of the sense amplifier 180. Accordingly, the equilibrate circuit 450 includes equilibrate circuit 350 and further includes a further equilibrate boosting circuit 382 including equilibrate boosting pass transistor 374 formed at the edge of the memory sub-array 150 and formed as a part of the memory sub-array 150. By way of illustration, equilibrate boosting pass transistor 374 connects the digit line DL2 162 to the digit line DL3 164 when activated by an equilibrate boosting signal 370. In one embodiment, the equilibrate boosting signal 370 is activated to match the duty cycle of the equilibrate signal 170 and equilibrate boosting signal 270. In another embodiment of the present invention, the equilibrate boosting signal 370 is activated during a portion of the activation of equilibrate signal 170 and equilibrate boosting signal 270 to provide an equilibration boost to the equilibrate circuit 450 by reducing the resistance of the digit line during the equilibration process. To form the connection with the extended end of digit line DL2 162, the digit line DL2 162 is formed to include an extended portion 390 of digit line DL2 162 at its extended end. In the present embodiment, the further equilibrate boosting circuit 382 is offset by one digit line from the equilibrate boosting circuit 282. This offset of equilibrate boosting circuits 282, 382 enables the formation of a network of pass gates that essentially shorts all digit lines DL1-DL5 together resulting in a common equilibration reference voltage across all of the digit lines DL.

The equilibrate boosting circuit 382 enhances equilibration speed by coupling the extended or unterminated end of the digit line during equilibration with an adjacent digit line very near an equilibrate circuit. The equilibrate boosting circuit 382 enables the charge on the digit line to be equilibrated from both ends of the digit line by connecting the extended or unterminated end of the digit line with an adjacent digit line that is physically near an equilibrate circuit. Equilibrating a digit line from both ends provides a lower resistance along the digit line as well as provides multiple current paths for charging or discharging the digit line resulting in faster equilibration times. In one embodiment, the equilibrate circuit utilized by the equilibrate boosting circuit 382 is located within the sense amplifiers 180. In another embodiment, the equilibrate boosting circuit 382 utilizes an equilibrate circuit 182 at the edge of the memory sub-array 150 as described with respect to FIGS. 3 and 4.

Figure 8:
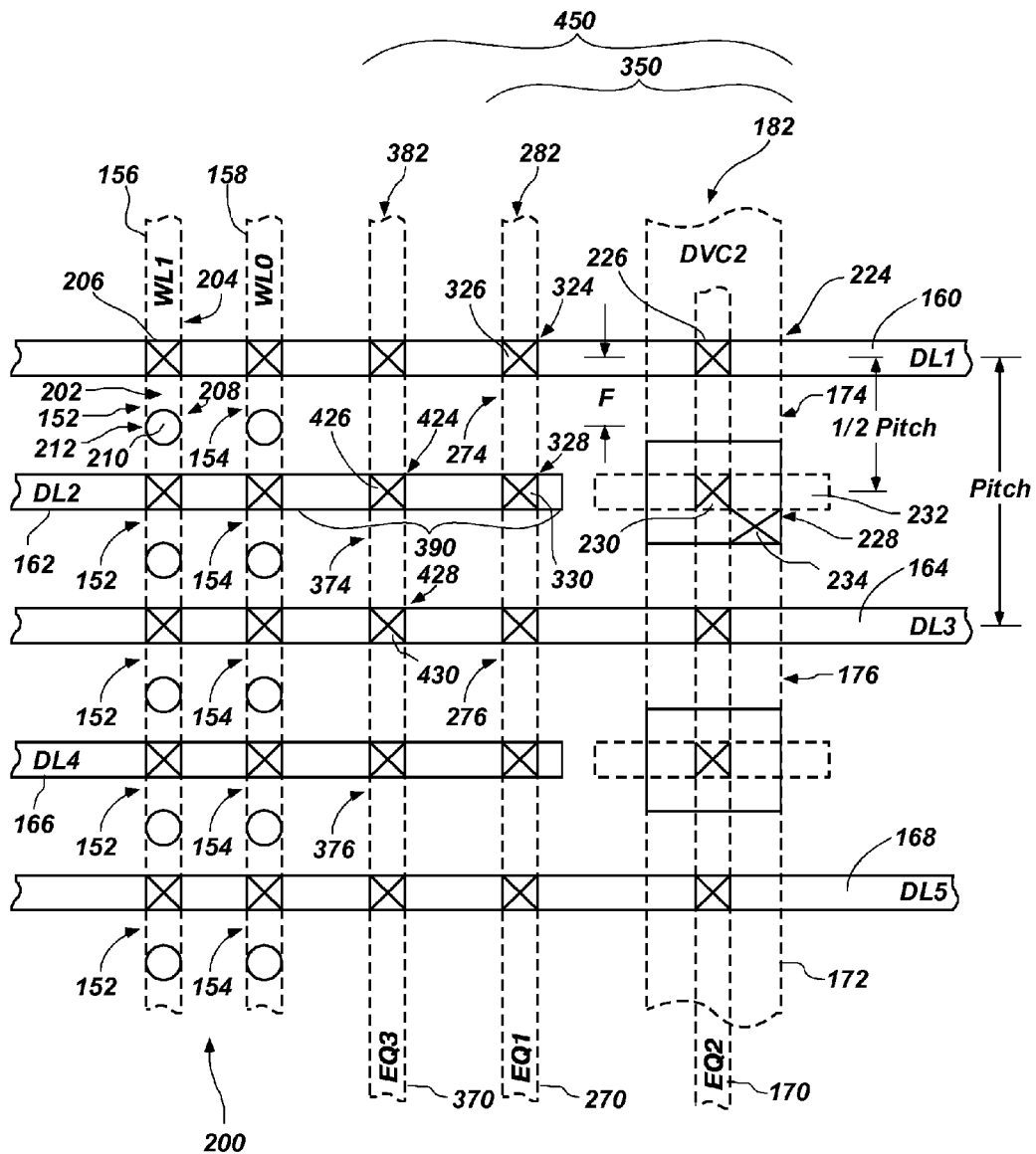
FIG. 8 illustrates a physical layout of the equilibrate circuit of FIG. 7, in accordance with various embodiments of the present invention.

FIG. 8 illustrates a physical layout of an edge of a sub-array of memory cells of the circuit illustrated in FIG. 7, according to one or more embodiments of the present invention. The equilibrate boosting circuit 382 includes an equilibrate boosting signal 370 for activating equilibrate boosting pass transistors 374, 376. According to the embodiment illustrated with reference to FIG. 8, the equilibrate boosting pass transistor 374 is configured as a vertically gated pass transistor formed at half the digit line pitch (width of the feature plus the space to the next repeated feature) of the memory sub-array. As stated, conventional equilibrate circuits have been formed according to the design parameters of the sense amplifiers, which are designed at much larger dimensions than the half pitch equilibration pass transistors of the equilibrate circuit of the various embodiments of the present invention.

The equilibrate boosting pass transistor 374 is also formed as a vertical transistor as are the memory cell pass transistors, however, the equilibration pass transistor 174 is formed as a long transistor to maintain similar processing steps as are performed during the manufacturing of the memory sub-array. The equilibrate boosting pass transistor 374 couples the digit line DL2 162 to digit line DL3 164 when the equilibration signal 370 is asserted. The equilibrate boosting pass transistor 374 is formed between a vertical pillar 424 configured for coupling by way of a contact 426 (denoted by an "X") to an extended portion 390 to digit line DL2 162. The equilibrate boosting pass transistor 374 is further formed to include another vertical pillar 428 configured for coupling via a contact 430 (denoted by an "X") of the digit line DL3 164.

As stated, the equilibrate circuit 450 may be implemented using equilibrate circuit 182 rather than relying on an equilibrate circuit in the sense amplifier. Accordingly, in another embodiment, an equilibrate circuit 450 may include the combination of equilibrate circuit 182, equilibrate boosting circuit 282, and equilibrate boosting circuit 382.

In a further embodiment of the present invention, a memory device is disclosed. The memory device includes a memory array configured in an open digit line architecture. The memory device further includes an equilibrate circuit including an equilibrate pass transistor configured to couple a terminated end of a first digit line to an equilibration reference and an equilibrate boosting circuit including a first equilibrate boosting pass transistor configured to couple an unterminated end of a second digit line to the terminated end of the first digit line, the first and second digit lines arranged directly adjacent to each other.

Figure 9:
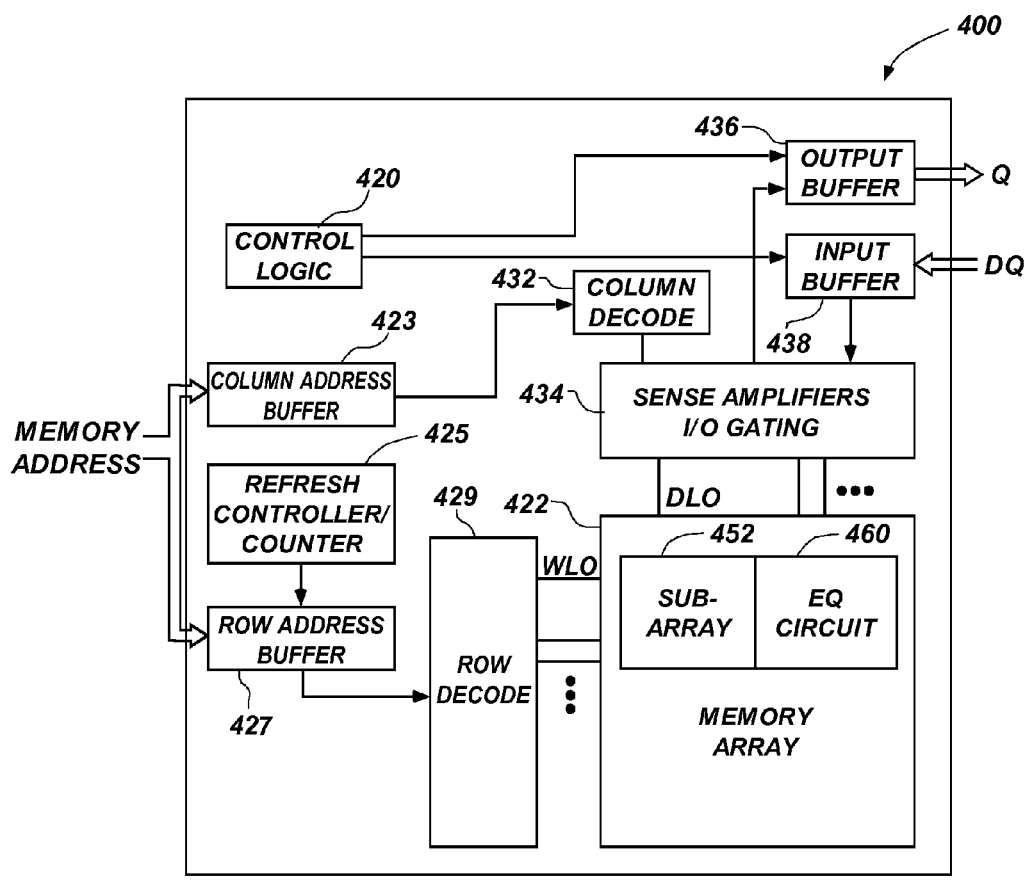
FIG. 9 is a block diagram of a memory device, in accordance with various embodiments of the present invention.

FIG. 9 is a block diagram of a memory device, in accordance with an embodiment of the present invention. A DRAM memory device 400 includes control logic circuit 420 to control read, write, erase and perform other memory operations. A column address buffer 423 and a row address buffer 427 are adapted to receive memory address requests. A refresh controller/counter 425 is coupled to the row address buffer 427 to control the refresh of a memory array 422. A row decode circuit 429 is coupled between the row address buffer 427 and the memory array 422. The memory array 422 includes a memory sub-array 452 and an equilibrate circuit 460, in accordance with the various embodiments of the present invention. A column decode circuit 432 is coupled to the column address buffer 423. Sense amplifiers-I/O gating circuit 434 is coupled between the column decode circuit 432 and the memory array 422. The DRAM memory device 400 is also illustrated as having an output buffer 436 and an input buffer 438. An external processor may be coupled to the control logic circuit 420 of the DRAM memory device 400 to provide external commands.

Another embodiment of the present invention discloses an electronic system. The electronic system includes a processor and a memory device operably coupled to the processor. The memory device includes a memory sub-array configured in an open digit line architecture and an equilibrate circuit. The equilibrate circuit includes an equilibrate pass transistor configured to couple a terminated end of a first digit line to an equilibration reference. The equilibrate circuit further includes an equilibrate boosting circuit including a first equilibrate boosting pass transistor configured to couple an unterminated end of a second digit line to the terminated end of the first digit line. Additionally, the first and second digit lines are arranged directly adjacent to each other.

Figure 10:
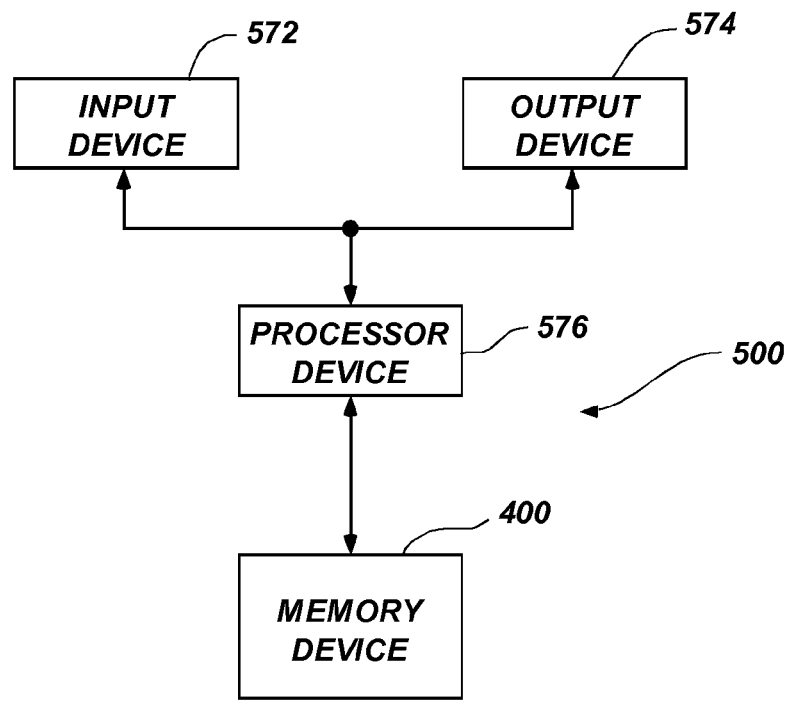
FIG. 10 is a block diagram of an electronic system, in accordance with various embodiments of the present invention.

FIG. 10 is a block diagram of an electronic system 500, in accordance with an embodiment of the present invention. The electronic system 500 includes an input device 572, an output device 574, and a memory device 400, all coupled to a processor device 576. The memory device 400 incorporates at least one memory sub-array and an equilibrate circuit according to one or more of the various embodiments disclosed herein.

A yet further embodiment discloses a semiconductor wafer including at least one memory array configured in an open digit line architecture. The memory array includes an equilibrate circuit configured to equilibrate a first digit line coupled to an equilibrate reference during an equilibrate process with an unterminated end of a second digit line.

Figure 11:
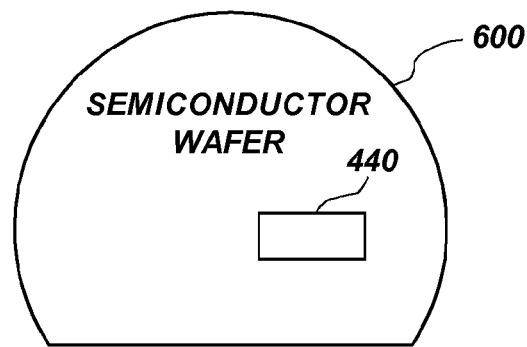
FIG. 11 is a diagram of a semiconductor wafer including an integrated circuit die incorporating one or more of the equilibrate circuits described herein, in accordance with various embodiments of the present invention.

FIG. 11 is a diagram of a semiconductor wafer including an integrated circuit die incorporating the memory array and capacitor-less memory cells of one or more of the previous embodiments, in accordance with a further embodiment of the present invention. As shown in FIG. 11, a semiconductor wafer 600 includes a yet-to-be-cut integrated circuit die 440 that incorporates one or more capacitor-less memory cells as herein disclosed.

The processes and devices described above illustrate embodiments of methods and devices out of many that may be used and produced according to the embodiments of the present invention. The above description and drawings illustrate embodiments which provide significant features and advantages of the present invention. It is not intended, however, that the present invention be strictly limited to the above-described and illustrated embodiments.

Although the present invention has been shown and described with reference to particular embodiments, various additions, deletions and modifications that will be apparent to a person of ordinary skill in the art to which the invention pertains, even if not shown or specifically described herein, are deemed to lie within the scope of the invention as encompassed by the following claims.

What is claimed is:

1. An apparatus, comprising:
a memory sub-array including memory cells located along digit lines;
a first sense amplifier block and a second sense amplifier block operably coupled with the memory sub-array on opposing sides of the memory sub-array, wherein the digit lines include:
a first digit line including:
a terminated end coupled with the first sense amplifier block; and an unterminated end proximate the second sense amplifier block; and a second digit line including:
a terminated end coupled with the second sense amplifier block; and an unterminated end proximate the first sense amplifier block; and
an equilibrate boosting circuit configured to couple the first digit line at its terminated end with the second digit line at its unterminated end responsive to an equilibrate boosting signal.

2. The apparatus of claim 1, wherein the plurality of digit lines further includes:
a third digit line including:
a terminated end coupled with the first sense amplifier block; and
an unterminated end proximate the second sense amplifier block; and
a fourth digit line including:
a terminated end coupled with the second sense amplifier block; and
an unterminated end proximate the first sense amplifier block.

3. The apparatus of claim 2, further comprising another equilibrate boosting circuit configured to couple the unterminated end of the second digit line and the terminated end of the third digit line responsive to another equilibrate boosting signal.

4. The apparatus of claim 2, further comprising an equilibrate circuit configured to couple the terminated end of the first digit line and the terminated end of the third digit line responsive to an equilibrate signal.

5. The apparatus of claim 4, wherein:
the equilibrate circuit includes a pass transistor configured to be activated by the equilibrate signal; and
the equilibrate boosting circuit includes an equilibrate boosting pass transistor configured to be activated by the equilibrate boosting signal.

6. The apparatus of claim 5, wherein the equilibrate boosting signal is activated to match a duty cycle of the equilibrate signal.

7. The apparatus of claim 5, wherein the equilibrate boosting signal is activated during a portion of activation of the equilibrate signal.

8. The apparatus of claim 4, wherein the equilibrate circuit utilized by the equilibrate boosting circuit is located within the first sense amplifier block.

9. The apparatus of claim 4, wherein the equilibrate circuit is located within the memory sub-array block.

10. The apparatus of claim 4, wherein the equilibrate circuit is configured according to layout criteria and processes of the memory sub-array block.

11. The apparatus of claim 4, further comprising another equilibrate circuit on the opposite side of the memory sub-array as the equilibrate circuit, the another equilibrate circuit configured to couple the terminated end of the second digit line and the terminated end of the second digit line responsive to another equilibrate signal.

12. An apparatus, comprising:
a memory sub-array block including memory cells configured according to an open digit line architecture, wherein each digit line includes:
a terminated end that couples to a sense amplifier block on one side of the memory subarray block; and
an unterminated end proximate another sense amplifier block on another side of the memory sub-array block; and
an equilibrate boosting circuit configured to equilibrate the plurality of digit lines at their terminated ends of the memory sub-array block with the plurality of digit lines at their unterminated ends of the memory sub-array block.

13. The apparatus of claim 12, wherein the equilibrate boosting circuit includes equilibrate boosting pass transistors adapted to couple the terminated ends and the unterminated ends of at least two adjacent digit lines on the same side of the memory sub-array block responsive to an equilibrate boosting signal being asserted.

14. The apparatus of claim 13, further comprising an equilibrate circuit including equilibrate pass transistors adapted to couple the terminated ends on the same side of the memory sub-array responsive to an equilibrate signal being asserted.

15. The apparatus of claim 14, wherein:
each equilibrate boosting pass transistor is configured as a vertical transistor;
each memory cell includes a memory cell pass transistor configured as a vertical transistor; and
each equilibrate pass transistor is configured as a long transistor.

16. The apparatus of claim 14, wherein each equilibrate pass transistor is configured as half of a digit line pitch.

17. A method, comprising:
equilibrating a charge on at least a pair of adjacent digit lines of a memory sub-array having an open digit line architecture by activating an equilibrate boosting circuit coupling a first digit line at its terminated end with a second digit line at its unterminated end responsive to an equilibrate boosting signal.

18. The method of claim 17, wherein equilibrating a charge on at least a pair of adjacent digit lines of a memory sub-array includes equilibrating the charge from both ends of the first digit line and the second digit line by coupling a terminated end of the second digit line with an unterminated end of the first digit line responsive to another equilibrate boosting signal.

19. The method of claim 17, wherein equilibrating a charge on at least a pair of adjacent digit lines of a memory sub-array includes equilibrating the charge by activating an equilibrate circuit coupling the terminated end of the first digit line to a reference voltage responsive to an equilibrate signal.

20. The method of claim 19, wherein equilibrating a charge on at least a pair of adjacent digit lines of a memory sub-array includes equilibrating the charge on a plurality of pairs of adjacent digit lines of the memory sub-array by activating a plurality of boosting pass transistors of the equilibrate boosting circuit by coupling terminated ends with unterminated ends of each pair of adjacent digit lines responsive to the equilibrate boosting signal.

\* \* \* \* \*